United States Patent [19]
Sundhar et al.

[11] Patent Number: 6,094,917
[45] Date of Patent: Aug. 1, 2000

[54] THERMO ELECTRIC HUMIDOR

[76] Inventors: Shaam P Sundhar, 6 Tall Timbers Dr., Princeton, N.J. 08540; Paul Vagnozzi, 533 Whitehead Rd. #B-2, Hamilton, N.J. 08619

[21] Appl. No.: 09/208,732

[22] Filed: Dec. 9, 1998

Related U.S. Application Data

[60] Provisional application No. 60/071,138, Jan. 12, 1998.

[51] Int. Cl.[7] ............................................... F25B 21/02
[52] U.S. Cl. ................................................. 62/3.4; 62/3.7
[58] Field of Search .................................. 62/3.2, 3.4, 3.6, 62/3.7

[56] References Cited

U.S. PATENT DOCUMENTS

| | | | |
|---|---|---|---|
| 3,168,816 | 2/1965 | Petrie . | |
| 3,973,938 | 8/1976 | Szabo et al. ................................ | 62/3.6 |
| 4,364,234 | 12/1982 | Reed ........................................... | 62/3.3 |
| 4,891,949 | 1/1990 | Caldarola .................................... | 62/3.2 |
| 5,299,424 | 4/1994 | Woodson et al. ........................... | 62/3.7 |
| 5,301,508 | 4/1994 | Kahl et al. .................................. | 62/3.62 |
| 5,483,799 | 1/1996 | Dalto .......................................... | 62/3.7 |
| 5,524,440 | 6/1996 | Nishioka et al. ........................... | 62/3.6 |
| 5,609,032 | 3/1997 | Bielinski .................................... | 62/3.7 |
| 5,782,094 | 7/1998 | Freeman ..................................... | 62/3.6 |

*Primary Examiner*—Henry Bennett
*Assistant Examiner*—Melvin Jones
*Attorney, Agent, or Firm*—Ourpal (R) Asija

[57] ABSTRACT

The system of this invention comprises a thermo electric module housed in an insulated box. The thermo-electric module in turn comprises a solid state thermo electric chip. The chip helps to maintain the desirable constant temperature and humidity. The system also includes a heat sink, a digital display, an HQ circuit, a thermostat and a direct current power source as well as an optional switch and an optional lock and associated hardware and an optional rechargeable battery source.

23 Claims, 4 Drawing Sheets

THERMOELECTRIC MODULE

THERMOELECTRIC CHIP

THERMO ELECTRIC HUMIDOR

RELATED DOCUMENT

This original application for a utility patent is based on provisional application Ser. No. 60/071,138 filed Jan. 12, 1998 then entitled "Cool Humidor System" which in turn was based on the disclosure document number 422,183 filed with the USPTO on Jul. 10, 1997 then entitled under the trademark name of KOOLTEMP Humidor.

BACKGROUND

This invention relates to a storage device for cigars, chocolates, make-up materials for artists and ladies and like things which need to be kept at cool temperature for personal use. More particularly it relates to the use of thermo-electric technology inside a insulated box for use as humidor, chocolates, make-up materials for artists and ladies and like things by anyone anywhere.

THE PROBLEM

The modern trend of expensive cigar smoking is increasing exponentially. In 1996 more than $1.5 billion worth of cigars were sold. If the cigars are not stored properly then they lose their unique properties.

Cigars must be kept in a humid atmosphere and at a cool temperature of around 65 F. Currently many use "humidors" which humidifies the cigar. A sponge like substance is soaked in water and kept inside the humidor. The water slowly evaporates which keeps the cigar moist.

However, to keep the cigars cool, people face the toughest hurdle. Either they lower the air conditioner of the entire room where the humidor is kept or they build a special room for the purpose of storing cigars. The 65 F room temperature is really cold for human beings. The special storage place construction needs extra space & resources.

If the cigars are not stored at around 65 degrees Fahrenheit then the larvae hidden in the wrappers will hatch as the temperature increases and goes beyond 70 degrees. Then they eat the tobacco by boring a number of holes thus destroying the expensive cigars.

SUMMARY

The system of this invention comprises a thermo electric module housed in an insulated box. The thermoelectric module in turn comprises a solid state thermo electric chip. The chip maintains the desirable constant humidity and temperature by pumping the heat from the interior of the box to ambient.

In the preferred embodiment the inventor used the direct current power source and maintained the temperature at around 65 degrees F.

PRIOR ART

A formal prior art search was not conducted but the inventor is intimately familiar with the prior art. Typical examples of the prior art known to the inventor or his attorney are the humidors which employ water soaked sponge, bulky compressors, CFC gases, coils etc.

Unfortunately none of the prior art devices singly or even in combination provide all of the features and objectives established by the inventor for this system as enumerated below.

OBJECTIVES

1. It is an objective of this invention to provide method, devices and system for a cool personal humidor.

2. Another objective of this invention is to provide a humidor system which is solid state with virtually no moving parts.

3. Another objective of this invention is that it be long lasting made from durable material.

4. Another objective of this invention is that it is easy to use, store and transport.

5. Another objective of this invention is that its use be intuitive that requires little additional training.

6. Another objective of this invention is that it be physically safe in normal environment as well as accidental situations.

7. Another objective of this invention is that it be environmentally friendly and safe and made from biodegradable materials to the extent practical.

8. Another objective of this invention is that it meet all federal, state, local and other private standards, guidelines and recommendations with respect to safety, environment, quality and energy consumption.

9. Another objective of this invention is that once set, it maintain constant temperature of 40 degrees F below ambient and humidity of approximately 70% automatically without any intervention or attention from the user.

10. Another objective of this invention is that it be made of modular parts and units easily interface-able to each other.

11. Another objective of this invention is that the personal cool humidor system of this invention be suitable as an accessory for OEM.

12. Another objective of this invention is that the personal cool humidor system of this invention is suitable for use anywhere.

13. Another objective of this invention is that the personal cool humidor system of this invention is suitable for use by anybody.

14. Another objective of this invention is that it be suitable for gift giving.

15. Another objective of this invention is that it be suitable for promotional give aways complete with message of the sponsor such as a casino or church or cigar makers.

16. Another objective of this invention is that the personal cool humidor system of this invention be of high quality with high aesthetic eye appeal.

17. Another objective of this invention is that the personal cool humidor system of this invention have a small foot print.

18. Another objective of this invention is that the personal cool humidor system of this invention is capable of cooling to and automatically maintaining a constant temperature around 65 degrees Fahrenheit.

Other objectives of this invention reside in its simplicity, elegance of design, ease of manufacture, service and use and even aesthetics as will become apparent from the following brief description of the drawings and concomitant description.

BRIEF DESCRIPTION OF THE DRAWINGS a). FIG. 1 is a perspective view of the humidor insulated box complete with a rear view of thermoelectric chip 200.

b) FIG. 2 is a perspective view of an alternate embodiment of humidor insulated box complete with rear view of thermoelectric chip 200 rear view , a temperature and humidity display 260 and a plurality of cigars 300.

c). FIG. 3(a) shows a schematic of the thermo electric module 235 and a cold sink 220.

d) FIG. 3(b) shows a more detailed view of the thermoelectric chip.

e) FIG. 4 shows a block diagram of the humidor system

DETAILED DESCRIPTION OF THE PREFERRED EMBODIMENT

The compact, convenient and solid state personal humidor system of this invention 100 as shown in the drawings wherein like numerals represent like parts throughout the several views, there is generally disclosed in FIG. 1 a perspective backside view of the humidor insulated box complete with a thermoelectric chip 200.

Figure 1:
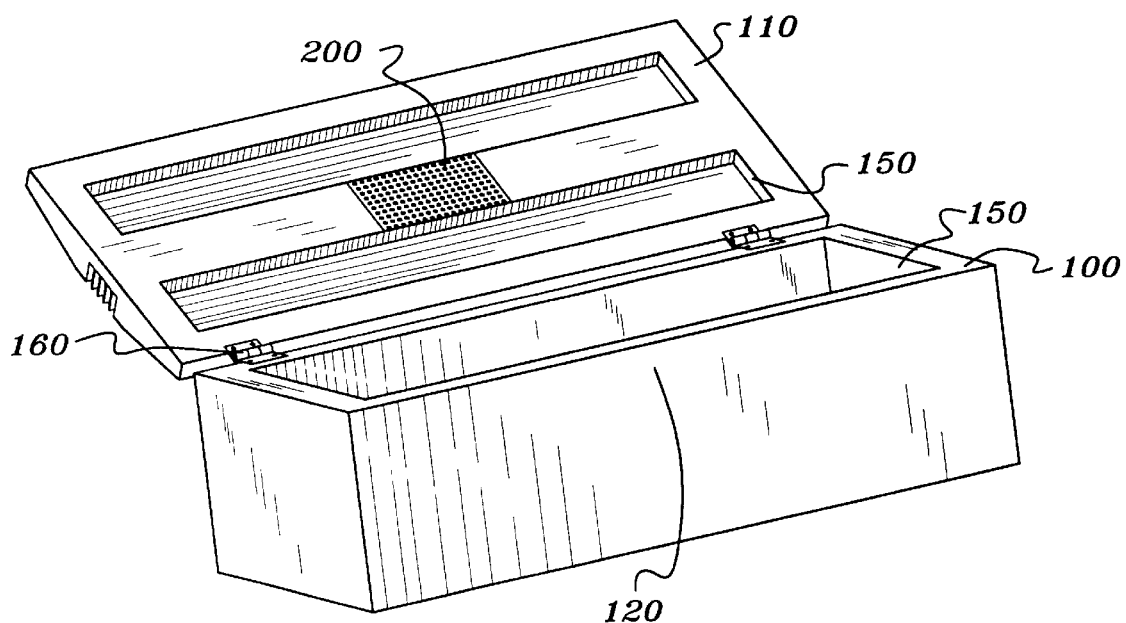
Figure 2:
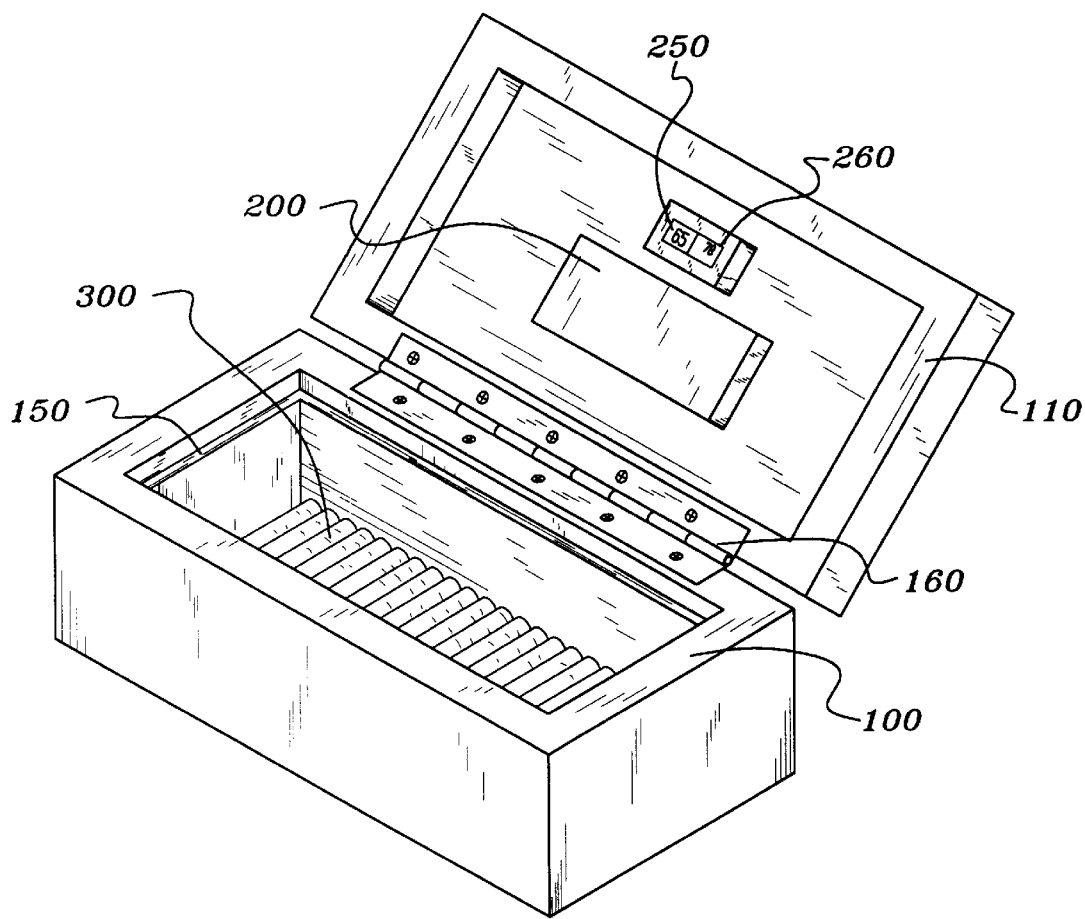
FIG. 2 is a perspective view of an alternate embodiment of humidor insulated box complete with back side thermoelectric chip 200, a temperature and humidity display and a plurality of cigars.

The solid state electronic ThermoElectric "Chip" cools a given volume of space without bulky compressors, CFC gases, coils etc. This space age technology uses the power from direct current source and keeps the humidor at the right temperature. By varying the current the inside temperature of the humidor can be accurately varied. An HQ circuit 245 senses the temp and with the help of a thermostat 240 it keeps the temperature at a pre-set level. The batteries 230 are rechargeable.

The system 100 of this invention comprises a thermo electric assembly module 200 which in turn comprises a solid state thermo electric chip 235, a heat sink 210. The system also includes a digital display comprising a digital hygrometer 265 and a digital thermometer 260.

Plurality of cigars 300 are also placed in the humidor box 100 which includes an optional lock 125. In the preferred embodiment the inventor used six D cells for the direct current power source not shown in the drawings.

Figure 3A:
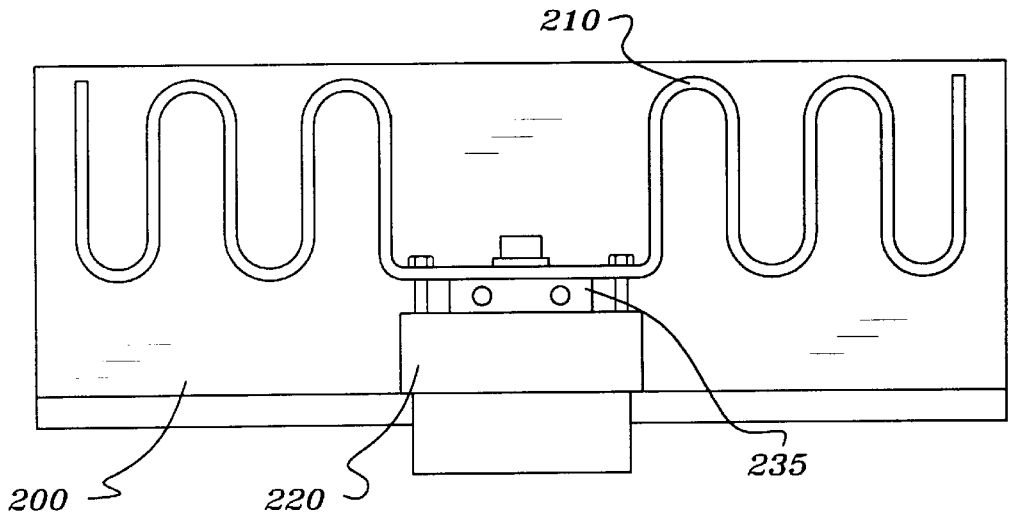
FIG. 3(a) shows a schematic of the thermo electric module/chip 235 and the cold sink 220. Similarly
Figure 3B:
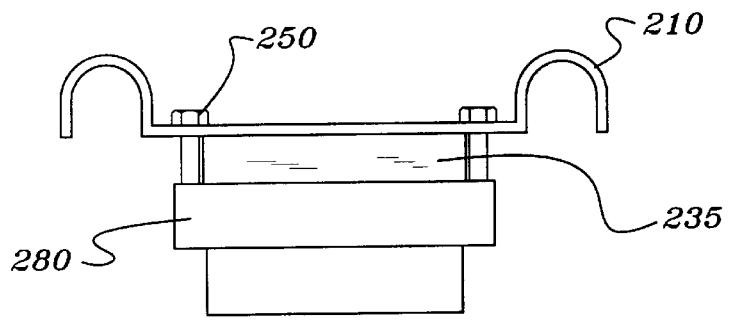
FIG. 3(b) shows a more detailed view of the thermoelectric chip.

FIG. 3 shows the interface between the thermo electric module's solid state chip and the cold sink in greater detail. In the preferred embodiment the inventor used Melcor model CP.8-71-O6L as the thermo electric chip 235. The approximate cooling area of the device is 40 thousand square millimeters or 60 square inches.

Figure 4:
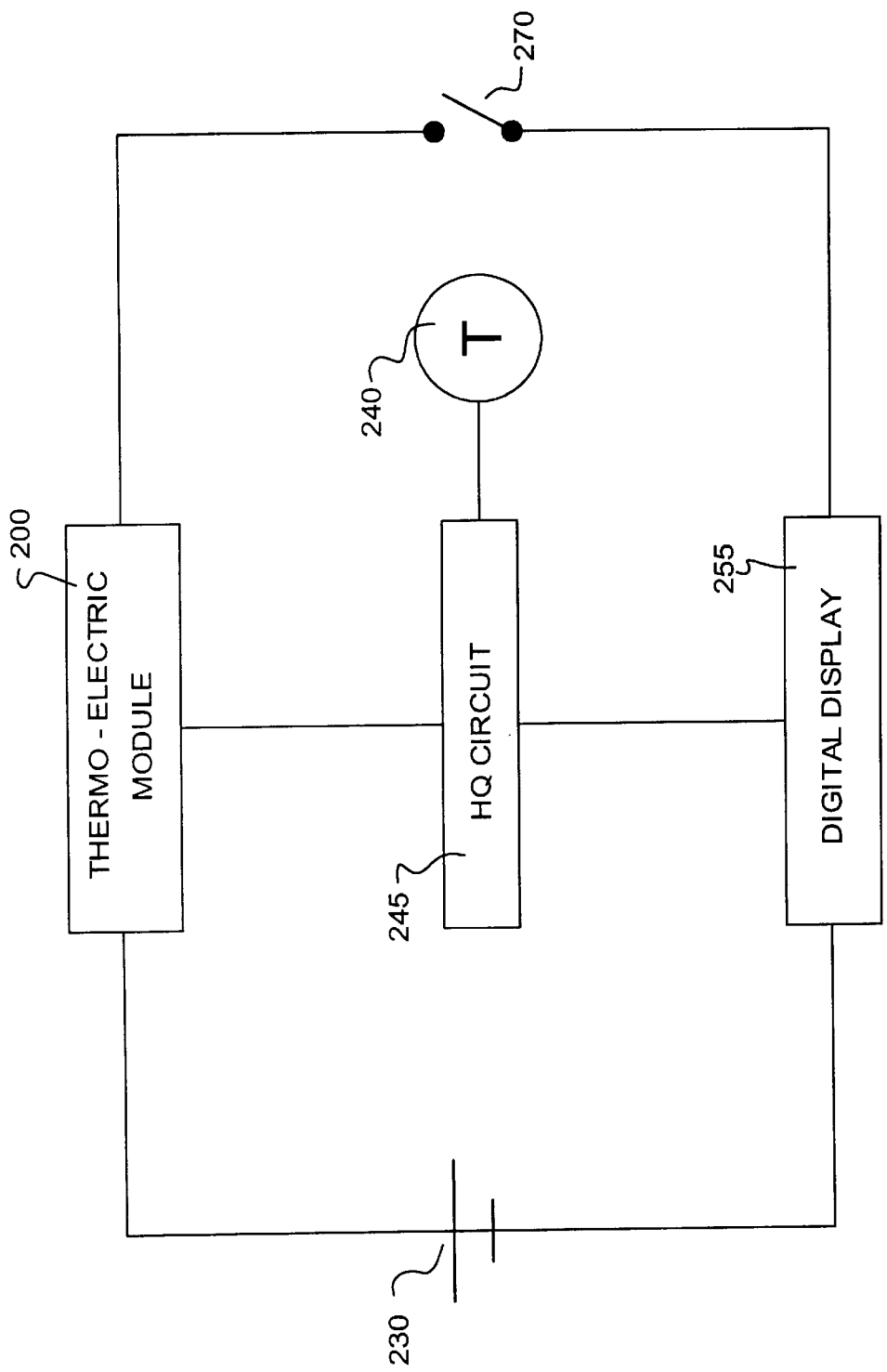
FIG. 4 shows a block diagram of the humidor system complete with rechargeable direct current power source 230 and thermostat 240.

FIG. 4 shows a block diagram of the humidor system complete with the thermo electric assembly module 200, (which in turn comprises a chip 235 and a heat sink 210, a power source 230, a digital display comprising digital hygrometer 265, digital thermometer 260 and a switch 270.

The solid state electronic cooling "Thermo Electric Chip" is the technology of the 21st century. Without the bulky compressors, CFC gases and coils, the chip cools. It can cool up to sub-zero temperatures and beyond. They can be designed to various BTU capacities. Their life is at least 200,000 hours, guaranteed.

A switch 270 is also provided in the system for conserving power when the box is empty or for extended period of non-use for any other reason.

OPERATION

The use and operation of this device by a consumer is simple and even intuitive. The operator after preparing the box as per instructions merely places the cigars in the insulated box, sets the humidifier storage and closes the humidor until a cigar is desired. The temperature is preset from the factory.

The inventor has given a non-limiting description of the concept. The simplicity and the elegance of the design of this invention makes it difficult to design around it. Nonetheless many changes may be made to this design without deviating from the spirit of this invention. Examples of such contemplated variations include the following:

1. The shape and size materials of the various members and components may be modified.

2. A different thermoelectric module may be used.

3. The color, aesthetics and materials may be enhanced or varied.

4. Additional complimentary and complementary functions and features may be added.

5. A more economical version of the device may be adapted with an informational or advertising message for promotional give aways.

6. A different type of insulation may be provided.

7. The volume and the cooling capacity may be varied by use of a thermo-electric module of appropriate specifications.

Other changes such as aesthetics and substitution of newer materials as they become available, which substantially perform the same function in substantially the same manner with substantially the same result without deviating from the spirit of the invention may be made.

Following is a listing of the components uses in this embodiment arranged in ascending order of the reference numerals for ready reference of the reader.

---

100 = Humidor box generally
110 = Lid or cover for the humidor box
125 = Optional Lock on humidor
150 = Insulation
160 = Hinge interface of the humidor box
200 = Thermoelectric module assembly
210 = Heat sink
230 = Direct current power source
235 = Thermo-electric solid state chip
240 = Thermostat
245 = HQ Circuit
255 = Digital display generally
260 = Digital Thermometer
265 = Digital Hygrometer
270 = Switch
300 = Cigars

---

DEFINITIONS AND ACRONYMS

A great care has been taken to use words with their conventional dictionary definitions. Following definitions are included here for clarification.

---

3D = Three Dimensional
CFC = Chloro Floro Carbon
DIY = Do It Yourself
HQ = A high quality circuit for
Integrated = Combination of two entities to act like one
Interface = Junction between two dissimilar entities

```
Isometric  = Drawings with equality of measure
             with the prototype of the inventor
OEM        = original Equipment Manufacturer
Symmetrical = The shape of an object of integrated
``` entity which can be divided into two along some axis through the object or the integrated entity such that the two halves form mirror image of each other.

Thermoelectric= A device to generate a thermal gradient when direct current power is applied.

While this invention has been described with reference to illustrative embodiments, this description is not intended to be construed in a limiting sense. Various modifications and combinations of the illustrative embodiments as well as other embodiments of the invention will be apparent to a person of average skill in the art upon reference to this description. It is therefor contemplated that the appended claim(s) cover any such modifications, embodiments as fall within the true scope of this invention.

The inventor claims:

1. A personal cool humidor system comprising:
   a) an insulated box;
   b) a thermo electric module assembly housed in said insulated box;
   c) a direct current source connected to said thermo electric module;
   d) a digital display also housed in said insulated box and connected to said thermo electric module and said direct current source;
   e) an HQ circuit connected to said thermo electric module and said digital display;
   f) a thermostat housed in said insulated box and connected to said HQ circuit; and
   g) a switch connected in series with said direct current source.

2. The personal cool humidor system of claim 1 wherein said thermo electric module assembly comprises a solid state thermo electric chip.

3. The personal cool humidor system of claim 1 wherein said thermo electric module includes a heat sink.

4. The personal cool humidor system of claim 1 wherein said direct current power source is a plurality of batteries.

5. The personal cool humidor system of claim 1 wherein said box includes a promotional message of a sponsor.

6. The personal cool humidor system of claim 1 wherein said digital display comprises a digital thermometer display and a digital hygrometer display.

7. The personal cool humidor system of claim 1 wherein said box includes a lock.

8. The personal cool humidor of claim 1 wherein said box includes a logo.

9. The personal cool humidor of claim 1 wherein said direct current power source comprises a plurality of rechargeable batteries.

10. The personal cool humidor system of claim 1 wherein said direct current power source is external.

11. The personal cool humidor system of claim 1 wherein;
    a) said thermo electric module comprises a solid state thermo electric chip, a cold plate and a heat sink;
    b) said direct current power source is rechargeable;
    c) said box has a lock;
    d) said box has a logo; and
    e) said digital display comprises a digital thermometer display and a digital hygrometer display.

12. A thermo electric personal humidor comprising:
    a) an insulated box;
    b) a sheath lining inside of said insulated box;
    c) a thermo electric module housed in said insulated box;
    d) a direct current source connected to said thermo electric module;
    e) a digital display also housed in said insulated box and connected to said thermo electric module and said direct current source;
    g) an HQ circuit connected to said thermo electric module and said digital display;
    h) a thermostat housed in said insulated box and connected to said HQ circuit; and
    i) a switch connected in series with said direct current source.

13. The thermo electric personal humidor of claim 12 wherein the insulation of said insulated box is of high "R" value.

14. The thermo electric personal humidor of claim 12 wherein said sheath is made of aluminum.

15. The thermo electric personal humidor of claim 12 wherein said sheath is made of copper.

16. The thermo electric personal humidor of claim 12 wherein said sheath is in the form of a wave so as to permit circulation of air.

17. The thermo electric personal humidor of claim 12 which includes a wooden platform with a plurality of openings at the bottom of said insulated box.

18. The thermo electric personal humidor of claim 12 which includes a heat sink with a plurality of rearwardly projecting fins.

19. The thermo electric personal humidor of claim 12 wherein said sheath is secured to said heat sink by a fastening means which passes through said insulation.

20. The thermo electric personal humidor of claim 12 wherein said direct current source comprises rechargeable batteries.

21. The thermo electric personal humidor of claim 12 wherein said thermo electric chip includes a cold sink sandwiched between said thermo electric chip and said sheath.

22. A thermo electric humidor comprising:
    a) an insulated container for cigars;
    b) a sheath lining inside said insulated container;
    c) a heat sink in said insulated box and in contact with said thermo-electric chip, which in turn is in contact with said cold plat which in turn is in contact with said sheath;
    d) a thermo electric chip in contact with said heat sink;
    e) a direct current power source;
    f) a digital display; and
    g) wherein said direct current power source comprises an ac to dc wall mounted converter.

23. A thermo electric humidor comprising:
    a) an insulated container for cigars;
    b) a sheath lining inside said insulated container;
    c) a heat sink in said insulated box and in contact with said thermo-electric chip, which in turn is in contact with said cold plat which in turn is in contact with said sheath;
    d) a thermo electric chip in contact with said heat sink;
    e) a direct current power source;
    f) a digital display; and
    g) wherein said digital display comprises a digital thermometer and a digital hygrometer.

* * * * *